United States Patent [19]
Osenbach

[11] Patent Number: 5,583,078
[45] Date of Patent: Dec. 10, 1996

[54] METHOD FOR FABRICATING A PLANAR DIELECTRIC

[75] Inventor: John W. Osenbach, Kutztown, Pa.

[73] Assignee: Lucent Technologies Inc., Murray Hill, N.J.

[21] Appl. No.: 469,737

[22] Filed: Jun. 6, 1995

Related U.S. Application Data

[63] Continuation of Ser. No. 248,570, May 24, 1994, abandoned, which is a continuation of Ser. No. 49,874, Apr. 19, 1993, abandoned, which is a continuation of Ser. No. 693,215, Apr. 30, 1991, abandoned.

[51] Int. Cl.⁶ .................................................. H01L 21/31
[52] U.S. Cl. ............................................ 437/240; 437/978
[58] Field of Search ................................. 437/238, 240, 437/978, 195; 148/DIG. 41, DIG.43; 427/255.3, 255.7

[56] References Cited

U.S. PATENT DOCUMENTS

| | | | |
|---|---|---|---|
| 4,217,375 | 8/1980 | Adams | 427/85 |
| 4,828,629 | 5/1989 | Ikeda et al. | 148/33.3 |
| 4,894,352 | 1/1990 | Lane et al. | 437/238 |
| 5,013,691 | 5/1991 | Lory et al. | 437/238 |

FOREIGN PATENT DOCUMENTS

| | | | |
|---|---|---|---|
| 0232748 | 8/1987 | European Pat. Off. | 437/240 |
| 63-062238 | 3/1988 | Japan | 437/238 |
| 2218131 | 8/1990 | Japan | |

OTHER PUBLICATIONS

*Proceedings Of The Fourth International IEEE VLSI Multilevel Interconnection Conference*, Jun. 15–16, 1987, "Photo CVC Technology for Interlevel Dielectrics in Submicron VLSIs," by Tsutomu Fujita et al., pp. 285–291.
Pai et al., J. Appl. Phys. 68(2), 15 Jul. 1990, pp. 793–801.
Wolf, "Silicon Processing For The VLSI Era: vol. 2" Lattice Press, Sunset Beach, Cal. (1990) pp. 194–199.
Kerr et al., Stabilization of $SiO_2$ Passivation Layers with $P_2O_5$, IBM Journal, Sep. 1964, pp. 376–384.
Becker et al., Low Pressure Deposition of Dopid $SiO_2$ by Pyrolysis of Tetraethylorthosilicate (TEOS)).
J. Electrochem. Soc.: Solid–State Science and Technology Nov. 1987 pp. 2923–2931.
IBM T.D.B., vol. 12, No. 12, May 1970, p. 2086 Balk et al., Oxide Stabilization Process.
Barry et al., Dopid Oxides as Diffusion Sources, J. Electrochem. Soc.: Solid State Science, Jun. 1969 pp. 854–860.

*Primary Examiner*—George Fourson
*Attorney, Agent, or Firm*—Richard D. Laumann

[57] ABSTRACT

Re-entrant angles in doped dielectrics produced from the decomposition of organo-silicon compounds are reduced or eliminated by the addition of a polar molecule to the dielectric deposition process.

8 Claims, 1 Drawing Sheet

METHOD FOR FABRICATING A PLANAR DIELECTRIC

This application is a continuation of application Ser. No. 08/248570, filed on May 24, 1994, abandoned, which is a continuation of Ser. No. 08/049874 filed on Apr. 19, 1993, abandoned, which is a continuation of 07/693215 filed on Apr. 30, 1991 abandoned.

TECHNICAL FIELD

This invention relates to semiconductor integrated circuit manufacturing processes which produce a planarized dielectric.

BACKGROUND OF THE INVENTION

As modern integrated circuit technology becomes more complex, individual circuits have more devices than did prior art circuits, and the devices in the circuits have smaller dimensions than did prior art devices. The goal of more and smaller devices in integrated circuits introduces additional processing and structural complexity as the goal can not be attained by simply scaling down feature size or increasing chip size. For example, the devices, e.g., field effect transistors, must be electrically contacted, and it is difficult to make all electrical interconnections on a single level because of geometrical constraints. Many integrated circuits therefore now have electrical interconnections on two or more levels. Forming the electrical interconnections is simplified if the dielectric layers used to separate different layers of metallization have planar surfaces. However, planar surfaces are frequently difficult to produce because of the complexity of the underlying topography.

Accordingly, methods have been developed for producing planar dielectric surfaces, but these methods are not completely satisfactory in all circumstances. For example, the dielectric can be deposited on the substrate and then a resist can be deposited on the dielectric surface. The resist has a planar surface as deposited and an etchback that removes both resist and dielectric at the same rate will leave a planar dielectric surface when all resist is removed. However, resists are likely to introduce sodium contamination into the dielectric which is undesirable. Alternatively, the deposited dielectric may also be heated to a temperature at which it flows, thereby at least reducing surface height variations.

A commonly used dielectric in integrated circuit fabrication is silicon dioxide produced by a method that uses silane as a precursor gas. The flow temperature of the silicon dioxide can be significantly reduced by the addition of relatively minor amounts of dopants such as boron or phosphorous. The reduction in flow temperature is generally proportional to the concentration of dopants, i.e., a higher dopant concentration produces a greater reduction in flow temperature than does a smaller concentration. Of course, some dopants are more effective in reducing flow temperature than are other dopants. Relatively low flow temperatures are desirable because they minimize adverse effects such as, e.g., n- and p-type dopant diffusion, that elevated temperatures can produce. However, the results produced by flowing the dielectric are generally not perfect, especially for high dopant concentrations.

Some of the problems associated with the planarization techniques described, particularly over closely spaced features such as runners, could be alleviated by the deposition of conformal dielectrics. For example, layers of conformal dielectrics, such as TEOS and BPTEOS, could be sequentially deposited until a planar surface is produced, i.e., until the space between features is substantially filled. However, it has been found that for some conditions, particularly for those dielectrics with relatively high dopant concentrations, the deposition process is not conformal but rather produces a dielectric surface having re-entrant angles. The re-entrant angle is the angle between the vertical surface and the largest tangent to the dielectric surface and it should be small. Large re-entrant angles are undesirable because they can prevent surface planarization from occurring in the flow process. Additionally, high dopant concentrations may decrease film stability.

Techniques that eliminate or reduce the magnitude of the re-entrant angles or which reduce the dopant concentration in the deposited dielectric layer would be desirable.

SUMMARY OF THE INVENTION

A method of integrated circuit manufacturing forms features on the surface of a substrate and then deposits a dielectric over the features. The deposition step uses an organo-silicon precursor gas which is decomposed to yield a silicon-containing component and that component, together with at least one polar molecule, is directed toward the substrate and forms the dielectric which is nominally undoped. In one embodiment, at least one flow temperature reducing dopant is also present in the dielectric. In another embodiment, the precursor gas is TEOS. The undoped dielectric is typically deposited before the doped dielectric is deposited. In another embodiment, the dopant is selected from the group consisting as P, B, and As. In yet another embodiment, the polar molecule is selected from the group consisting of $NH_3$ and $N_2O$.

The concentration of the polar molecule can be adjusted to produce an essentially conformal layer. If desired, the dielectric deposition can be continued until spaces between features have been filled and a planar surface produced.

For reasons of clarity, the elements depicted are not drawn to scale.

DETAILED DESCRIPTION

The invention will be described by reference to a particular embodiment. Other embodiments will be mentioned and others will be apparent to those skilled in the art.

Figure 1:
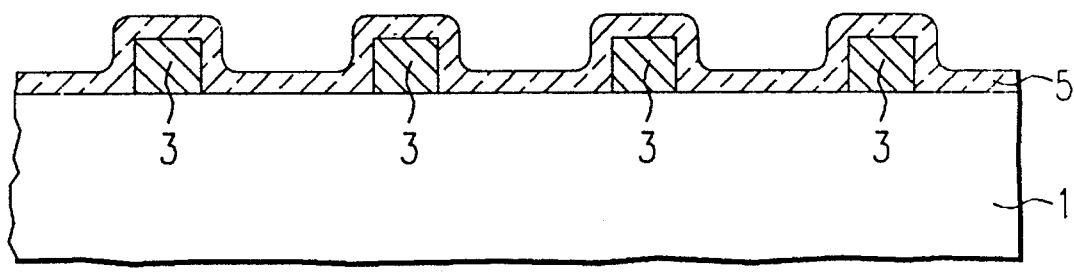
FIGS. 1–3 are sectional views of a portion of an integrated circuit at different stages in the manufacturing process according to this invention.

FIG. 1 is a sectional view of a portion of an integrated circuit at an early stage of manufacture. Depicted are substrate 1, a plurality of features 3 disposed on the surface of substrate 1, and first dielectric layer 5. The term substrate is used to mean a material which lies underneath and supports another material. Contemplated substrate materials include single crystal silicon, field oxides, upper level dielectrics, etc. The features 3 may be gate runners, electrical interconnections, etc., and may comprise, e.g., polysilicon, silicides, conducting nitrides, etc. The first dielectric layer 5 is desirably a conformal dielectric such as one obtained from the decomposition of an organo-silicon compound. An exemplary compound is TEOS. This compound is well known to those skilled in the art. The first dielectric is typically nominally undoped to avoid unwanted dopant diffusion from the dielectric. Nominally, undoped means that no materials are deliberately added to the dielectric but that minor amounts of unwanted components may be present.

Those skilled in the art will be able to fabricate the structure depicted as well as the individual device elements which are not depicted for reasons of clarity. For example, conventional patterning techniques, deposition techniques, etc., can be used. Appropriate dimensions and materials will be readily selected. Appropriate precursor gases, flow rates, temperatures, etc., will also be readily selected by those skilled in the art.

It is believed that the invention will be better understood if a brief, qualitative description of the likely deposition mechanism that produces conformal layers in plasma enhanced chemical vapor deposition (PECVD) is presented. The organo-silicon precursor gas decomposes in the gas phase and the silicon containing component, which will be referred to as $T^*$, strikes the surface. Due to the temperature, the components have a significant amount of thermal energy and move along the surface until they find an appropriate site, i.e., a site which minimizes the free energy of the surface. At the site, the component breaks up and the hydrocarbon portion leaves the surface, and the oxygen-silicon portion remains. The average distance traveled by the component before an appropriate site is reached may be referred to as the mean free path; and, for the mechanism described, the mean free path is relatively long. It will be readily appreciated that a long mean free path is required if a relatively conformal dielectric surface is to be obtained; i.e., a conformal surface means a long mean free path was present.

The process is more complicated when dopants such as, e.g., P, are present, and it is believed that the following mechanism explains the formation of re-entrant angles in the doped dielectric. P is typically added from a precursor gas such as TMP or phosphine, $PH_3$. The precursor gas decomposes in the atmosphere and the phosphorous containing component, which is polar and slightly charged, strikes the surface at an active site and remains at that site. This charged component reacts quickly with $T^*$. This reaction effectively reduces the mean free path for $T^*$ and leads to re-entrant angles because the $T^*$ components can no longer move along the surface to minimize the free energy of the system. The result is effectively a directional deposition, as the $T^*$ components do not reach the vertical surfaces in sufficient numbers to prevent re-entrant angle formation, i.e., an insufficient number of $T^*$ components reach the vertical surface. The re-entrant angles become larger as the dopant concentration increases because the mean free path is decreased by the increased dopant concentration.

Figure 2:
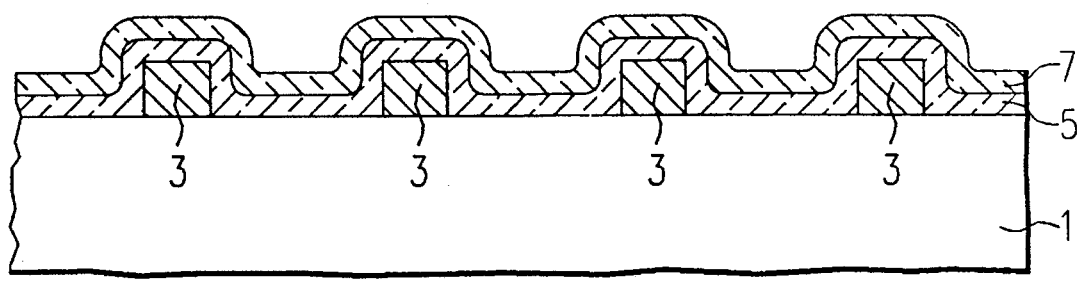

FIG. 2 is a sectional view after a second dielectric layer 7 has been deposited according to this invention. As can be seen, the re-entrant angles are very small. This dielectric layer is also produced from a organo-silicon precursor gas and a dopant containing gas. That is, a deposition process similar to that used for first dielectric layer 5 may be used. In one embodiment the dopants are selected from the group consisting of B, P, and As. The layer has polar molecules, and it is believed that this component effectively prevents the formation of large re-entrant angles through the following mechanism. In another embodiment, the polar molecules are selected from the group consisting of $NH_3$ and $N_2O$. Gases such as $NH_3$ and $N_2O$ are polar molecules which are quickly absorbed on the surface and occupy sites which the P species could otherwise occupy. This effectively increases the mean free path for the $T^*$ component and it can move to an appropriate low energy surface site which leads to conformal deposition. Those skilled in the art will readily select appropriate deposition parameters such as flow rate, precursor gases, temperatures, etc.

Figure 3:
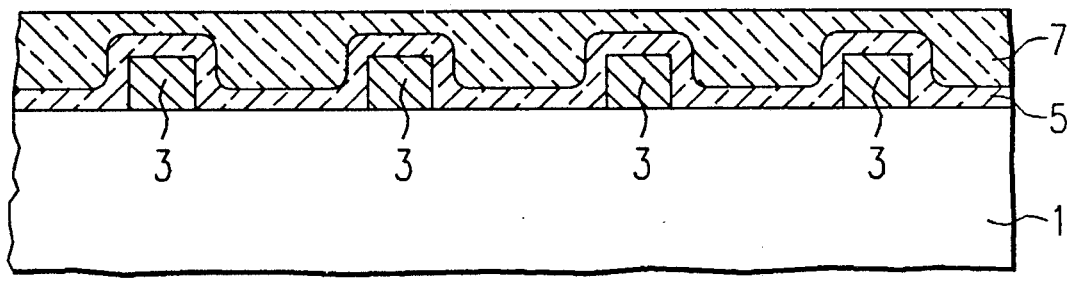

The process may be continued until substantially all of the space between features has been filled. The resulting structure is depicted in FIG. 3 and has a substantially planar surface. Similar structures produced by prior art processes have a low density seam midway between features where the dielectrics from adjacent features meet. The low density seam is undesirable because it is more susceptible to etching than are the higher density regions. However, the viscosity of the described layer is relatively low, even at low deposition temperatures, e.g., those between 300° and 450° C.; and low temperatures appear to cause the two growing interfaces to fuse as the layer is deposited, so that no low density seam is observed.

Figure 4:
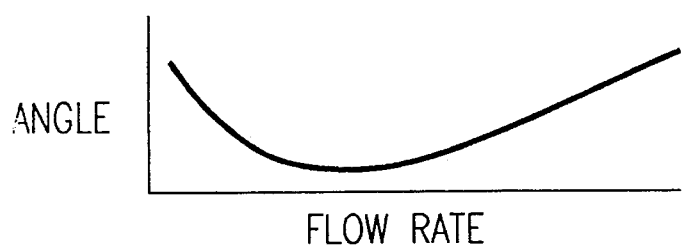
FIG. 4 plots the re-entrant angle vertically versus flow rate horizontally in arbitrary units for an exemplary polar molecule useful in this invention.

Optimum results, in terms of minimization of the re-entrant angle, can be obtained by varying the flow rate of the polar molecule. The effect of such variation is schematically represented in FIG. 4 which plots the re-entrant angle vertically versus the flow rate horizontally in arbitrary units. For zero flow rate, i.e., no polar molecules are present, the re-entrant angle is large for reasons which have already been explained. As the flow rate is increased, the re-entrant angle decreases to a minimum and then begins to increase again. The general structure of the curve is the same for different polar molecules, although the flow rate at which the minimum occurs varies from molecule to molecule.

The structure of the curve can be qualitatively understood from the following considerations. There are always some ions from the polar molecule present in the plasma and such ions occupy surface sites that the dopant atoms would otherwise occupy. It will be appreciated that, other parameters being constant, the ion concentration will be higher for $NH_3$ than it is for $N_2O$ because of the lower ionization energy. Thus, the re-entrant angle initially decreases as flow rate increases because the polar molecule increases the $T^*$ mean free path. The re-entrant angle reaches a minimum and then increases as the number of ions which act to desorb the adsorbed polar molecule, as well as to decompose $T^*$, increases and therefore decreases the mean free path of $T^*$. It will be readily appreciated by those skilled in the art that no ions are created in non-plasma enhanced deposition processes and that the curve saturates at the minimum in such processes. Appropriate choice of a polar molecule will be readily made by the skilled artisan. There are thus two mechanisms present and they dominate in different regimes. Those skilled in the art will readily devise and execute appropriate experiments or calculations to determine optimum flow rates for polar molecule as well as for the other gases.

It will be readily appreciated from the discussion that polar molecules are incorporated into the dielectric in relatively small concentrations. For example, $10^{17}/cm^3$, or smaller, is an exemplary concentration. This concentration does not appear to have any adverse effects and may even be beneficial by reducing B or P diffusion. However, significantly higher concentrations may be undesirable because they may significantly increase the dielectric viscosity.

After the deposition of layer 7 has been completed, further processing may be performed. For example, the dielectric may be flowed and/or patterned to form windows which expose selected portions of the substrate and/or polysilicon/metal interconnections. These windows may be filled with conducting material and electrical interconnections formed on the dielectric surface. The planar surface makes layer 7 suitable for use as an upper level dielectric as well as dielectric 1. The further processing steps are well known to those skilled in the art and need not be described in further detail.

The addition of the polar molecule, e.g., $NH_3$ or $N_2O$ to the deposition process improves the flow properties of the dielectric because of the improved step coverage. The dielectric flow is an attempt by the system to decrease the surface free energy so that the overall free energy of the system is minimized. If we assume that the surface energy of the system is not significantly altered by the addition of $NH_3$ and $N_2O$, to the deposition process, the free energy of the system is minimized via minimizing the surface area. This assumption is reasonable as the nitrogen content in these films is small. The total flux of material which flows is proportional to the gradient of the radius of curvature. As the re-entrant angle becomes smaller, the radius of curvature also decreases (smaller re-entrant angle) and the amount of flux increases and flow improves.

Other embodiments will be readily apparent to those skilled in the art. For example, precursor gases such as tetramethylcylclotetrasilane (TOMCATS) and diethylsilane (DES) may be used. Additionally, the method described may be used in other applications where the mean free path of T* is important. For example, CVD and PECVD dielectrics frequently exhibit a radial variation in thickness; the dielectric thickness increases as the distance from the center of the wafer increases for reasons similar to those discussed with respect to mean free path variation. Such thickness variations can be reduced by the addition of the polar molecule to the deposition process. This dielectric may be undoped. Features other than those described are contemplated. For example, the features may be regions having a conductivity different from that of the bulk substrate.

I claim:

1. A method of integrated circuit manufacturing comprising the steps of forming features on a surface of a substrate; and, depositing a first layer of silicon dioxide over said features, said depositing comprising the steps of decomposing an organo-silicon precursor gas to yield a silicon containing component, and directing said component together with at least one flow temperature reducing dopant and at least one polar molecule to said features on said surface of said substrate, said polar molecule being selected from the group consisting of $NH_3$ and $N_2O$, the flow rate of said polar molecule being selected to produce an essentially conformal layer.

2. A method as recited in claim 1 comprising the further step of depositing a second layer of silicon dioxide by decomposing an organo-silicon precursor gas to yield a silicon-containing component, and directing said component together with at least one polar molecule to said features on said substrate.

3. A method as recited in claim 1 in which said the precursor gas comprises at least one member selected from the group consisting of TEOS, TOMCATS, and DES.

4. A method as recited in claim 1 in which said dopant is at least one member selected from the group consisting as P, B, and As.

5. A method as recited in claim 4 in which said deposition is continued until spaces between features have been substantially filled and a planar surface produced.

6. A method of integrated circuit manufacturing comprising the steps of forming features on a surface of a substrate; and, depositing a first layer of silicon dioxide over said features, said depositing comprising the steps of decomposing an organo-silicon precursor gas to yield a silicon containing component, and directing said component together with at least one flow temperature reducing dopant and one polar molecule selected from the group consisting of $NH_3$ and $N_2O$, to said features on said surface of said substrate.

7. A method as recited in claim 6 in which said the precursor gas comprises at least one member selected from the group consisting of TEOS, TOMCATS, and DES.

8. A method as recited in claim 7 in which said dopant is at least one member selected from the group consisting as P, B, and As.

\* \* \* \* \*